United States Patent

Kelley

[11] Patent Number: 6,131,646
[45] Date of Patent: Oct. 17, 2000

[54] HEAT CONDUCTIVE INTERFACE MATERIAL

[75] Inventor: Lawrence R. Kelley, Redondo Beach, Calif.

[73] Assignee: TRW Inc., Redondo Beach, Calif.

[21] Appl. No.: 09/008,758

[22] Filed: Jan. 19, 1998

[51] Int. Cl.[7] ............................. H05K 7/20; F28F 27/00
[52] U.S. Cl. ...................... 165/80.1; 165/80.2; 165/80.3; 165/185; 165/76; 165/81; 165/41; 165/86; 361/704; 361/707
[58] Field of Search ............................. 165/41, 44, 185, 165/80.2, 80.3, 277, 81, 86; 361/704, 707

[56] References Cited

U.S. PATENT DOCUMENTS

| | | | |
|---|---|---|---|
| 1,934,174 | 11/1933 | Dyckerhoff | 154/28 |
| 2,984,457 | 5/1961 | Wulc | 165/80.3 |
| 3,006,979 | 10/1961 | Rich | 165/80.2 |
| 3,013,745 | 12/1961 | Galway et al. | 165/44 |
| 3,193,610 | 7/1965 | Worden, Sr. | 165/80.2 |
| 3,212,564 | 10/1965 | Passman et al. | 165/185 |
| 3,244,224 | 4/1966 | Hnilicka, Jr. | 165/32 |
| 3,438,430 | 4/1969 | Kestemont | 165/277 |
| 3,449,172 | 6/1969 | Dingwall | 165/81 |
| 3,463,224 | 8/1969 | Myers | 165/277 |
| 3,482,198 | 12/1969 | Hopper, Jr. | |
| 3,867,244 | 2/1975 | Adams | 161/133 |
| 4,273,183 | 6/1981 | Altoz et al. | 165/32 |
| 4,654,754 | 3/1987 | Daszkowski . | |
| 4,659,601 | 4/1987 | Elliott et al. | 428/36 |
| 4,858,072 | 8/1989 | Chall, Jr. | 361/388 |
| 4,871,015 | 10/1989 | Foley et al. | 165/86 |
| 4,926,935 | 5/1990 | Haushalter | 165/185 |
| 4,974,119 | 11/1990 | Martin . | |
| 5,031,689 | 7/1991 | Jones et al. . | |
| 5,111,577 | 5/1992 | Sheridan et al. | 29/890.039 |
| 5,254,178 | 10/1993 | Yamada et al. | 126/204 |
| 5,268,813 | 12/1993 | Chapman | 361/704 |
| 5,423,498 | 6/1995 | Fluegel | 244/117 |
| 5,524,406 | 6/1996 | Ragland | 52/406.2 |
| 5,528,456 | 6/1996 | Takahashi | 165/80.2 |

FOREIGN PATENT DOCUMENTS

| | | | |
|---|---|---|---|
| 2327196 | 12/1974 | Germany | 165/185 |
| 2913061 | 10/1980 | Germany | 165/185 |
| 1575414 | 9/1980 | United Kingdom . | |

Primary Examiner—John K. Ford
Attorney, Agent, or Firm—Michael S. Yatsko

[57] ABSTRACT

There is provided a technique for removing unwanted heat from a heat generating device 12 operating aboard a space vehicle orbiting in outer space by placing a heat conductive interface 10 between the device and a support platform 14. The interface 10 comprises an array of spaced apart strips 16 made of aluminum aligned in spaced apart relationship so that the array covers the heat dissipating surface 20 at the underside of the device, the strips 16 are configured by deformable protuberances, such corrugations 22 which flatten under compression forces forming a heat conductive interface between the device 12 and the platform 14.

8 Claims, 3 Drawing Sheets

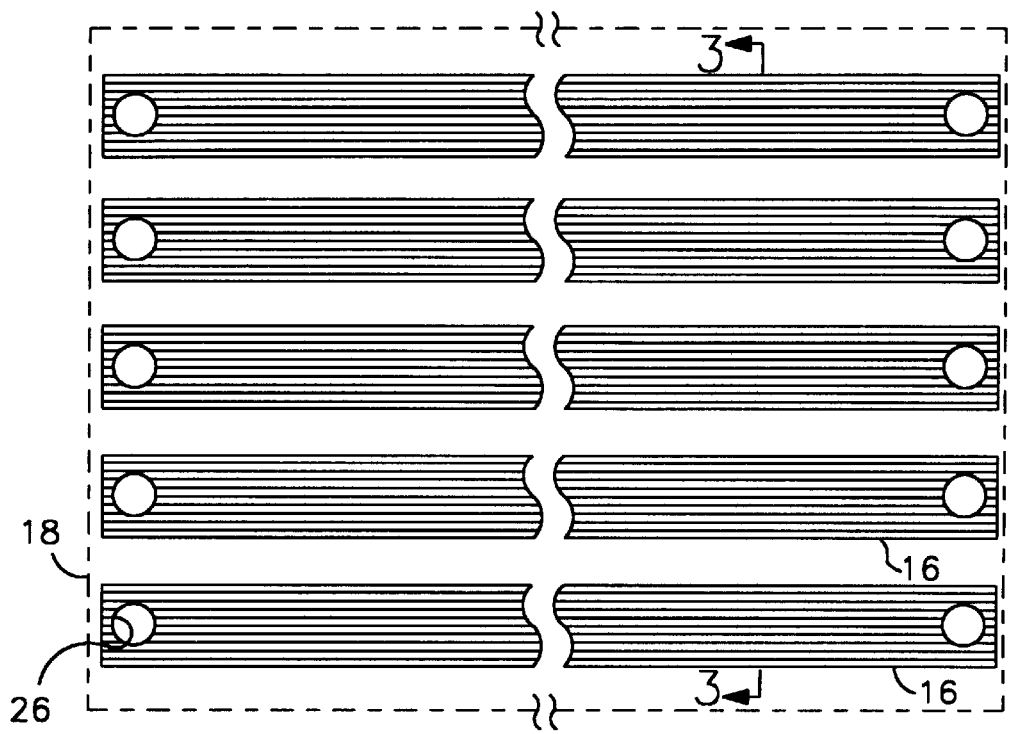
FIG. 2
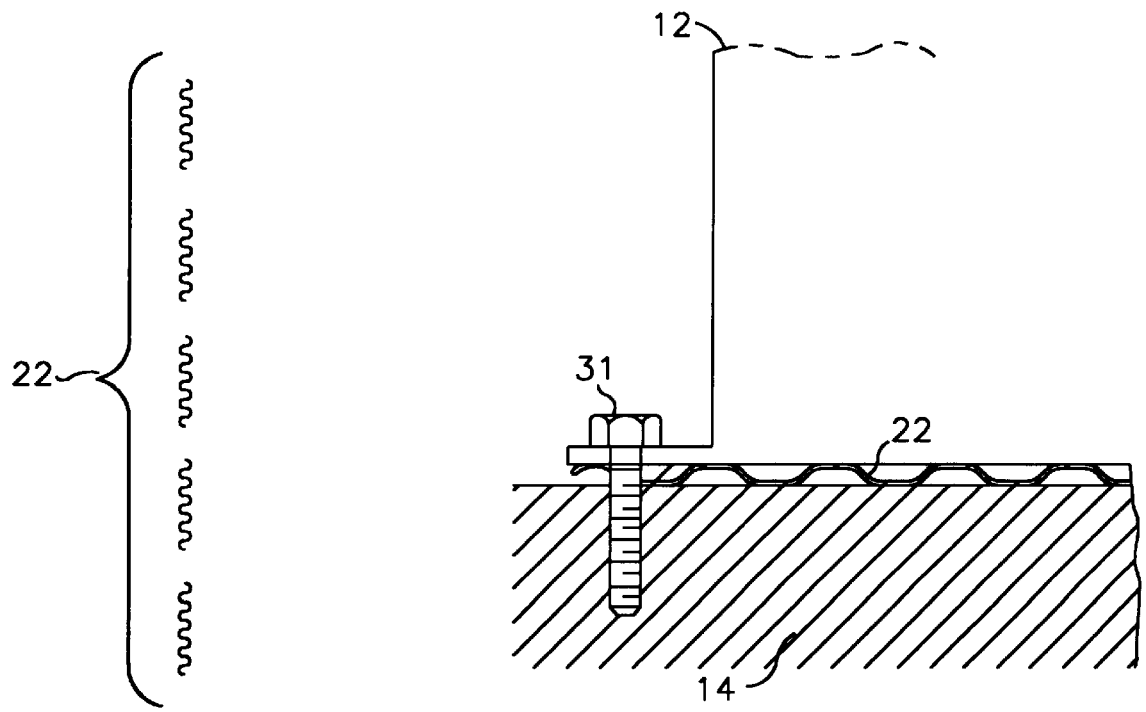
FIG. 3
FIG. 4

HEAT CONDUCTIVE INTERFACE MATERIAL

This invention relates generally to techniques for removing heat generated by devices aboard vehicles operating in outer space and more particularly to the construction of heat conductive interfaces for effectively conducting heat away from the heat generating devices.

BACKGROUND

Vehicles operating in outer space present a special problem in terms of being able to effectively dissipate unwanted heat generated by certain on board equipment. For example, it is necessary to get rid of the heat that is produced by electronic components and computing devices or otherwise run the risk of having such devices malfunction due to over heating. Typically, such components are mounted to a platform, panel, or other support structure which is part of the space vehicle. In addition to providing mechanical support for the component, such structure often provides the main heat sink path for cooling the component.

Spacecraft mounting platforms and panels are usually comprised of a thermally conductive facesheet bonded to one or both sides of an aluminum honeycomb core. The facesheets spread any locally imposed heat load laterally thus increasing the area from which the heat can be radiated to space. Typically, such facesheets are made of aluminum or graphite filament reinforced plastic (GFRP). Another well-known cooling technique involves the use of heat pipes, some times embedded in the support structure, to conduct heat to a remotely located radiator panel where it can be more readily rejected to space.

Such techniques and structures have proved useful and generally perform well, but not without certain disadvantages that are encountered in attaching the heat generating components and devices to the support structure. These components and devices are generally packaged in metal boxes with at least one surface designated as a baseplate from which most if not all heat dissipated within the box must be removed via thermal conduction. To remove the heat with an acceptably small temperature rise across the interface joint requires intimate thermal contact between the baseplate and the support structure over the entire baseplate "footprint" area.

Surface oxidation and microscopic irregularities and waviness (even on seemingly clean flat surfaces) create a microscopic gap over much of the area between the baseplate and the platform to which it is bolted. This microscopic gap limits heat transfer over that area to radiation coupling. Some heat also transfers across the gap via gaseous conduction in cases where atmospheric air is present. Thermal impedance imposed by the gap is often referred to as "contact resistance". Good metal to metal thermal conduction is limited to small areas directly under or very near hold-down screws where tremendous normal-direction forces can jam the peaks and valleys together. In a vacuum environment, gaseous conduction is lost but the overall heat transfer coefficient (the ratio of heat flow rate per unit of joint area to temperature difference across the joint) can still be enhanced by placing a compliant and thermally conductive medium in the gap.

The standard interface filler currently used by TRW and others for enhancing the heat transfer coefficient when mounting heat dissipating boxes to spacecraft platforms or panels is RTV (room temperature vulcanizing rubber). This material is silicone based and is initially a liquid into which a catalyst is mixed just prior to application to one or both surfaces to be joined. Excess filler material is squeezed out from the edges as the hold-down screws are tightened and is either removed in liquid form, allowed to cure in place and then cut off and removed, or simply left in place. The resulting interface joint provides good thermal contact with little or no distributed force applied to the joined members but the RTV filler creates the following problems:

Out-gassing

Even though low-volatility RTV products have been developed, a certain amount of out-gassing and potential contamination of optical or other critical surfaces still exists.

Component Removal

It is often necessary to remove an installed box or component for replacement or rework. In order to accommodate this possibility, a release agent must be applied to both surfaces prior to applying the RTV filler material to the interface joint. Even then, it can be very messy and risky to cleanup the residual RTV in preparation for reinstalling the box—especially if the box is in the form of a "slice" sandwiched between adjacent similar slice-shaped boxes.

De-lamination

When an aluminum box is mounted to a GFRP platform or panel, differential thermal expansion in the longitudinal direction can cause normal direction tensile stress in the interface filler material in the region between widely spaced hold-down screws during the hot portion of a thermal cycle. If the release agent "releases" due to this normal direction tensile stress, the mode of heat transfer across the interface joint reverts to radiation coupling resulting in a potentially catastrophic decrease in heat transfer coefficient.

One type of Configured Aluminum Foil that has been tested extensively consists of several narrow strips corrugated lengthwise and placed in a parallel pattern. Edge-to-edge spacing is made sufficiently wide to prevent interference between adjacent strips as they expand laterally during draw-down. The relatively unconstrained lateral expansion allowed by this configuration drastically reduces the normal-direction force required to flatten the interface medium. This is an important advantage for areas far removed from the hold-down screws (such as at or near mid-span) because a high distributed load tends to flex or bend the parts enough to cause severe loss of heat transfer in the center section.

A similar lengthwise flexing or bending can occur because of differential thermal expansion when aluminum boxes are mounted to GFRP (Graphite Filament Reinforced Plastic) panels. This is a potential problem for RTV filled interface joints where a release agent is used because the joint is in tension in the normal direction during high temperatures and can thus "release" when maximum heat transfer is required. Thermal cycling tests revealed that the CAF interface medium must be springy to survive. Dead-soft aluminum (1100-0) gave superior initial results but failed during the first hot-cycle after having been compressed during the cold-cycle. 5052-H191 aluminum alloy is obviously not the only springy material that could be used and may not be the best, but it does survive thermal cycling.

Electrical Grounding Impedance

It is generally required that electronic boxes be well grounded to the platform or panel to which they are mounted. In order to achieve adequate electrical grounding, gold-plated wire mesh (screen) tabs are placed in the RTV directly under each hold-down screw. In the case of an aluminum box mounted to an aluminum panel, introduction of the screen tabs leads to a slightly thicker layer of RTV than would otherwise be required. The resultant increase in weight and reduction in thermal conductance is generally acceptable. However, differential thermal expansion between an aluminum box and a GFRP panel can produce rapid degradation of electrical grounding as the few points of contact between the gold plated screen and the mating surfaces slide back and forth during thermal cycling.

Box to panel interface joints typically involve widely spaced hold-down screws. Replacing cured-in-place-RTV filler with a pre-cured sheet, gasket, or membrane of RTV or other compliant material produces a poor heat transfer coefficient for such interface joints relative to what is obtainable with cured-in-place RTV. There are at least two reasons for this difference:

Contact Resistance

Introducing any pre-cured or dry medium into the interface joint amounts to replacing the single contact resistance between the base plate and the platform with two new contact resistances—one for each side of the medium. The magnitude of the resultant thermal impedance depends on the force applied, the roughness of the mating surfaces, the softness of the medium material, and the thermal conductivity of the medium material.

Almost no normal-direction force is applied to the mating parts when using cured-in-place RTV because it is installed as a liquid and any force imposed by tightening the hold-down screws quickly relieves itself by squeezing excess RTV out the edges. Never the less, virtually 100% area contact is obtained between each of the mating surfaces and the RTV filler because each surface is wetted by RTV in the liquid state. Thus contact resistance is nil but thermal resistance through the RTV itself may be significant depending on its thermal conductivity and thickness.

Load Deflection

If a pre-cured sheet of RTV or similarly resilient material were placed between two rigid surfaces and these surfaces were then pressed together with enough force, the resulting contact resistance would probably be similar to that obtainable with cured-in-place RTV.

Real-life base plates, platforms, and panels used on spacecraft tend to flex or bow in regions between hold-down screws as a result of the distributed load associated with compressing a resilient interface gasket. The magnitude of deflection increases approximately as the cube of screw spacing. Tests have shown that for a center to center screw spacing of approximately 11 inches, deflection at the midpoint between screws often exceeds the uncompressed thickness of the gasket which of course means total loss of contact in that region.

Accordingly, there is a need for a technique for creating a reliable, durable and effective heat conductive interface that is simple to use, will endure the rigors of satellite launching and plays into the cost effectiveness of satellite construction.

SUMMARY

There is provided by this invention a heat conductive interface medium that is placed between the base plates of the heat generating devices aboard a vehicle adapted to operate in outer space. The heat generating devices are secured to a support platform on the vehicle that carries the heat generating devices. The heat conductive interface medium is comprised of a series of spaced apart heat conductive metal strips, each extending along one dimension of the base plate, and covering the entire surface area of the heat generating device. The strips are configured with deformable protuberances that increase the contact area between the mating surfaces when compressed. In other words, the metal strip disposed between the platform and the base plate of the heat producing device is flattened. In its flattened condition, it conforms to whatever contour results when the device is bolted against the platform filling most irregularities between the heat emitting surface and the platform, whether due to buckling or any other irregularities.

The strips can be appropriately heat conductive metals, such as steel, beryllium, copper or aluminum. The preferred material is aluminum.

DRAWINGS

These and other features, aspects and advantages of the present invention will become better understood from the following description, appended claims, and accompanying drawings where:

FIG. 2 is a plan view of the array of heat conducting configured strips, showing the corrugated form prior to deformation;

FIG. 3 is a cross section of the array of FIG. 2 taken along 3—3 showing the corrugated deformations;

FIG. 4 is an enlarged detail showing the interface material compressed between the heat generating device and the support platform;

DESCRIPTION

Figure 1:
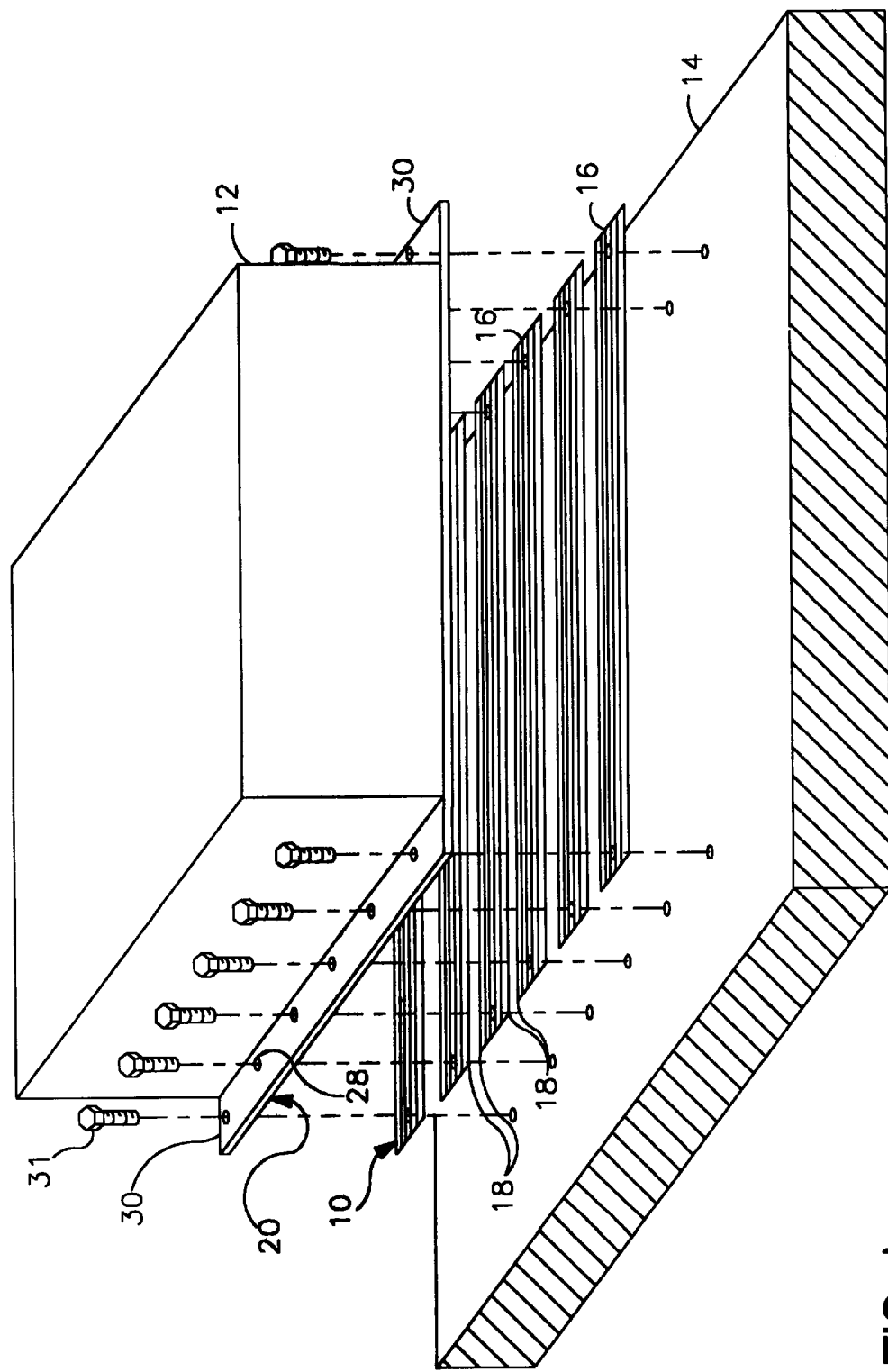
FIG. 1 is an exploded perspective view showing the heat generating device in position to be bolted to the satellite support platform with the configured heat conductive strips forming the heat conductive interface.

The heat conductive interface material of this invention comprises an array of spaced apart metal strips configured with deformable protuberances which are flattened when subjected to compression. Referring to FIG. 1 there is shown the heat conductive interface identified generally with the numeral 10, disposed between the heat generating device 12 and the support platform 14 of a space orbiting vehicle (not shown). The interface 10 is comprised of a series of metal strips 16 aligned with one another in spaced apart in relation with the space 18 between each strip. The array of spacings 18 and strips 16 occupy the entire area beneath the heat generating device 12 and form nearly a full interface between the device 12 and the platform 14 when compressed. The undersurface area, or base plate, of the heat generating device 12 is affixed to platform 14 and it becomes the heat transferring surface area 20 that works in conjunction the heat conductive interface 10 to dissipate the heat that is formed or generated by the device. The surface areas of the interface 10 should preferably be coextensive with the area 20 for optimum heat removal.

It will be appreciated that the type of deformations formed in the metal strips can take a variety of configurations. The primary criteria being that upon compression, the deformation will conform to the undersurface 20.

Referring to FIGS. 2 and 3, the strips 16 have been deformed with corrugations 22 that run in the longitudinal direction of the strip. The length dimension of the strip preferably equals one of the dimensions of the heat emitting surface area 20. In terms of the preferred uncompressed width, it has been found that good to excellent results are obtained in the range of 0.5 to 1.0 inches, the preferred range being about 0.55 to 0.60 inches. The uncompressed spacing 18 between the strips preferably is in the range of 30% to 60% of the width dimension of the strip, the preferred spacing being about 50% of the width dimension.

Referring to FIG. 4, there is shown the interface assembly 10 comprised of strips 16 having the corrugated deformations 22 (FIG. 3) compressed between the heat generating device 12 and the support platform 14. It will be appreciated that deformations 22 when compressed by tightening the bolt 31 will cause the strip to expand laterally tending to decrease the spacings 18 between each strip and at the same time partially crush the deformations increasing the heat conductive contact with the under surface of the heat generating device.

Figure 5:
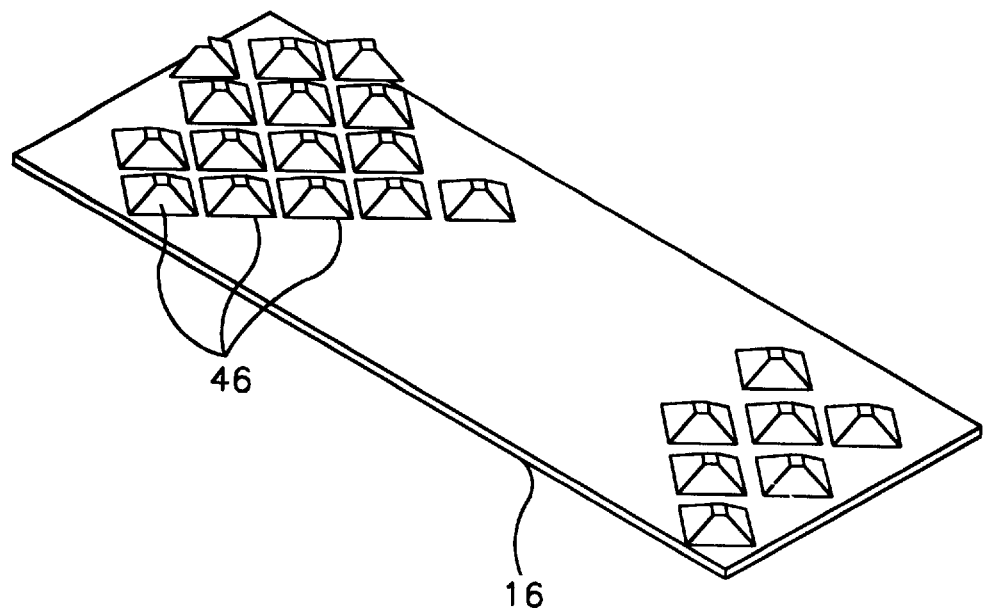
FIG. 5 is a perspective of a portion of a strip formed with domes.
Figure 6:
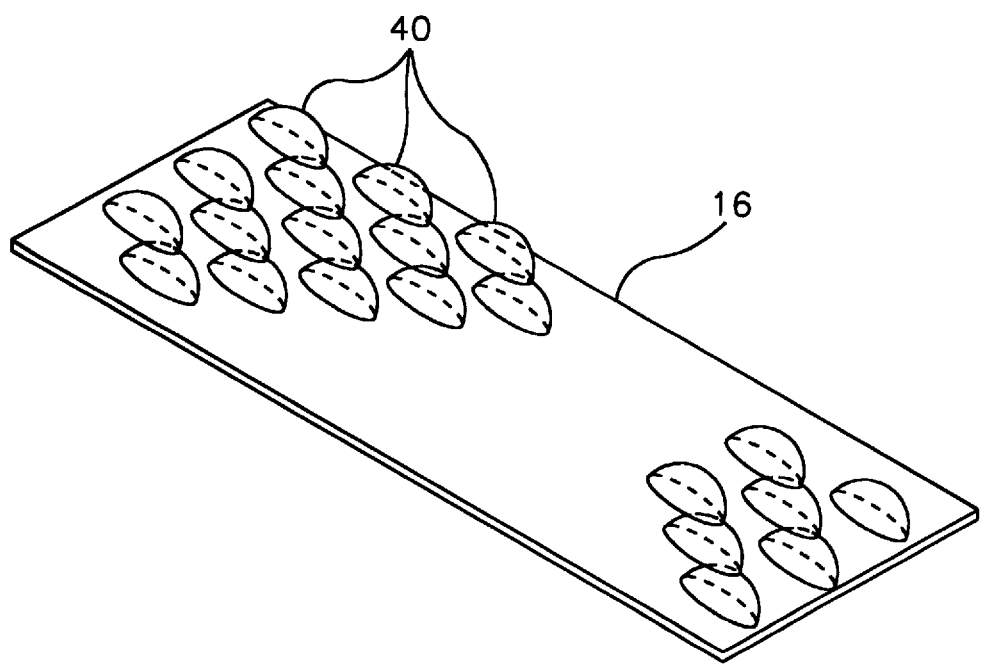
FIG. 6 is a perspective of a portion of a strip formed with pyramids.

FIGS. 5 and 6 illustrate other types of deformations that can be imparted to the interface foil 16 such as a series of closely spaced dimples or domes 40 (FIG. 6). Aluminum foil with an initial thickness of 1.5 mils can be embossed with the domes 40 to a thickness of 18 mils or more. FIG. 5 illustrates a pyramid type of embossment 46 which can have a similar formed thickness. For a given foil thickness, both of these patterns impose significantly greater distributed loads on the members being joined than does the corrugated pattern.

With respect to the corrugations 22, the preferred size is largely a function of the kinds of irregularities that one might encounter with the heat dissipating surface. For most applications, the size of the deformation should be in the range of 9% to 15% of the width of the strip, the preferred range being from 10% to 12%. In terms of the material that make up the strip, the preferred metal is aluminum and in particular aluminum alloy 5052, with a hardness value in the range of H34 to H38. The material must be sufficiently hard so that it has the proper degree of resiliency, to survive the rigors of thermal cycling. The thickness of the aluminum foil (which does not change much with compression of the corrugations), is in the range of 1.1 to 1.6 mils, the preferred range being 1.25 to 1.35 mils.

Other metals can be used such as thin foils of steel and copper. It is anticipated that the invention would work successfully with layered combinations of metal coated with heat-conductive compositions or combinations of metal. Prospectively, in certain applications it may be advantageous to copper-clad the aluminum sheets, or use gasket-type sheets laminated to the aluminum.

Referring again to FIG. 1, in practice an interface assembly 10 was prepared using strips, 15 inches in length and 0.56 inches wide. The strips were laid out on the platform 14 with suitable holes 26 (FIG. 2) formed at the longitudinal ends that coincide with the holes 28 in the flanges 30 extending from the edges of the heat generating device 12. The interface foil 16, with corrugations 22 measuring 0.050–0.060 inches in height, which is approximately 10% of the width, were placed facing the undersurface 20. The bolts 31, once inserted, were tightened, which compressed the deformed strips against the surface 20. As shown in FIG. 4, the strips become flattened when subjected to the pressure of securing the device to the platform 14 and the strips 12 tend to expand laterally (not illustrated) into the adjacent spaces 18 between each strip. It is the compression and expansion that forms the heat conductive interface 10, which is effective to conduct the heat into the platform 14. The measured heat conductance of the aforedescribed interface is in the range of 85 to 100 BTU per square foot, per hour, per degree Fahrenheit.

Although the present invention has been described in considerable detail with reference to certain preferred versions thereof, other versions are possible. Therefore, the scope of the appended claims should not be limited to the description of the preferred versions contained herein.

What is claimed is:

1. A heat transfer apparatus comprising:
 a heat generating device having a heat dissipating surface, said heat generating device including a first flange on one side of the device and a second flange on an opposite side of the device;
 a platform;
 a heat conductive interface disposed between said heating dissipating surface and said platform, said heat conductive interface including a plurality of spaced apart heat conductive strips extending longitudinally in one direction along an area defined by said heat dissipating surface, said strips being separate from each other and forming spaces therebetween, each strip including a series of corrugations, wherein a plurality of bolts extend through the first flange and through openings in one end of the strips to be threadedly engaged into the platform and wherein a plurality of bolts extend through the second flange and an opening in an opposite end of the strips to be threadedly engaged into the platform so that pressure from securing the heat generating device to the platform by the bolts causes the strips to expand laterally into the spaces to form a nearly continuous heat conductive contact between the heat generating device and the platform in response to applying a compressive force securing the heat generating device to the platform.

2. The apparatus of claim 1 wherein said heat conductive strips are made of aluminum.

3. The apparatus of claim 1 wherein said heat generating device is bolted to said platform by side bolts.

4. The invention apparatus of claim 2 wherein the thickness of each strip is in the range of 0.5 to 2.0 mils and wherein the height of each corrugation is in the range of 9% to 15% of the width dimension of the strip.

5. A method for providing a heat conductive interface between a heat generating device having a heat dissipating surface and a platform, said heat generating device including a first flange on one side of the device and a second flange on an opposite side of the device, said method comprising the steps of:
 providing a plurality of planar strips made of a heat conductive metal for placement between said heat dissipating surface of said heat generating device and said platform;
 forming corrugations in each strip that flatten in response to compressive forces;
 arranging the strips parallel to one another on the surface in a spaced apart relation so that spaces are defined between adjacent strips;
 disposing said strips between said heat generating device and said platform;
 positioning bolts through the first and second flanges, through an opening in ends of each strip, and into the platform; and
 applying a compressive force by threading the bolts into the platform to secure said heat generating device to the platform;
 wherein said corrugations flatten and each strip expands laterally into said spaces between adjacent strips.

6. The method of claim 5 wherein said heat conductive interface strips are made of aluminum.

7. The method of claim 5 wherein said heat generating device is bolted to said platform by said bolts.

8. The method of claim 5 wherein the thickness of each metal strip is in the range of 0.5 to 2.0 mils and wherein the height of each corrugation is in the range of 9% to 15% of the width dimension of the strip.

* * * * *